US012800682B2

(12) United States Patent
Gorbold et al.

(10) Patent No.: US 12,800,682 B2
(45) Date of Patent: Nov. 17, 2026

(54) MAGNETIC SENSING DEVICE

(71) Applicant: Analog Devices International Unlimited Company, Limerick (IE)

(72) Inventors: Jeremy Gorbold, Newbury (GB); Jochen Schmitt, Biedenkopf (DE); Kieran Berney, Limerick (IE); Gavin Cosgrave, Enniscorthy (IE); John O'Dowd, Crecora (IE)

(73) Assignee: ANALOG DEVICES INTERNATIONAL UNLIMITED COMPANY, County Limerick (IE)

( * ) Notice: Subject to any disclaimer, the term of this patent is extended or adjusted under 35 U.S.C. 154(b) by 54 days.

(21) Appl. No.: 17/863,239

(22) Filed: Jul. 12, 2022

(65) Prior Publication Data

US 2023/0016196 A1 Jan. 19, 2023

Related U.S. Application Data

(60) Provisional application No. 63/222,314, filed on Jul. 15, 2021.

(51) Int. Cl.

*G01R 33/09* (2006.01)
*G01D 5/14* (2006.01)
*G01D 5/165* (2006.01)

(52) U.S. Cl.

CPC .......... *G01R 33/096* (2013.01); *G01D 5/145* (2013.01); *G01D 5/165* (2013.01); *G01R 33/091* (2013.01)

(58) Field of Classification Search

CPC ...... G01R 33/07; G01R 33/072; G01R 33/09; G01R 33/091; G01R 33/093;

(Continued)

(56) References Cited

U.S. PATENT DOCUMENTS 10,393,197 B2 8/2019 Baehr et al.
10,415,998 B2 9/2019 Dietrich et al.

(Continued)

FOREIGN PATENT DOCUMENTS

CN 112146555 A 12/2020
DE 102020115906 A1 9/2021

(Continued)

OTHER PUBLICATIONS

Op-Amp Analog Voltage Adder, obtained from https://bluepichu.wordpress.com/2013/05/26/op-amp-analog-voltage-adder/, obtained on Dec. 4, 2023, published May 26, 2013. (Year: 2013).*

(Continued)

*Primary Examiner* — David M Schindler

(74) *Attorney, Agent, or Firm* — Knobbe, Martens, Olson & Bear, LLP

(57) ABSTRACT

The present disclosure provides a method of providing quadrant information to a magnetic sensing device comprising a magnetic angle sensor, and in particular, a magnetic angle sensor configured to provide 180° absolute angle measurements, such as a 180° anisotropic magnetoresistive (AMR) angle sensor, such that the magnetic sensing device outputs an analog signal encoded with 360° information. In this respect, magnetic sensing device is provided with a magnetic angle sensor and a quadrant detector, which may be provided on the same substrate or two separate substrates, wherein the signal from the quadrant detector is encoded into the analog sine and cosine voltage outputs from the magnetic angle sensor such that the two analog outputs provide 360° angle information.

13 Claims, 18 Drawing Sheets

(58) Field of Classification Search
CPC .. G01R 33/095; G01R 33/096; G01R 33/098; G01R 33/0029; G01B 7/14; G01B 7/30; G01D 5/142; G01D 5/145; G01D 5/147; G01D 5/16; G01D 5/165
See application file for complete search history.

(56) References Cited

U.S. PATENT DOCUMENTS

| | | | | |
|---|---|---|---|---|
| 10,731,737 | B2 | 8/2020 | Dietrich et al. | |
| 10,739,163 | B2 | 8/2020 | Heyd et al. | |
| 11,060,571 | B2 | 7/2021 | Dietrich | |
| 11,398,765 | B2 | 7/2022 | Buchet et al. | |
| 11,536,297 | B2 | 12/2022 | Hodrus | |
| 12,111,220 | B2 | 10/2024 | Hintze et al. | |
| 2009/0115405 | A1 * | 5/2009 | Guo | G01D 5/145 427/598 |
| 2012/0223699 | A1 * | 9/2012 | Holman, Jr. | G01D 5/145 324/207.2 |
| 2013/0265036 | A1 * | 10/2013 | Friedrich | G01R 33/0094 324/207.13 |
| 2017/0248661 | A1 * | 8/2017 | Blagojevic | G01R 33/072 |
| 2017/0276514 | A1 * | 9/2017 | Schmitt | G01D 5/16 |
| 2017/0276740 | A1 * | 9/2017 | Schmitt | G01R 33/091 |
| 2019/0257671 | A1 * | 8/2019 | Osabe | G01D 5/12 |
| 2020/0182314 | A1 | 6/2020 | Wei et al. | |
| 2020/0348150 | A1 * | 11/2020 | Cesaretti | G01D 5/16 |
| 2022/0355863 | A1 | 11/2022 | Lindenmayr et al. | |
| 2024/0317300 | A1 | 9/2024 | Pathan | |

FOREIGN PATENT DOCUMENTS

| | | | |
|---|---|---|---|
| DE | 102021111644 | A1 | 11/2022 |
| DE | 102022102110 | A1 | 8/2023 |
| DE | 102022132777 | A1 | 6/2024 |
| EP | 3523608 | A1 | 8/2019 |
| JP | 4224033 | B2 | 2/2009 |
| WO | WO 2018/028739 | A1 | 2/2018 |
| WO | WO 2018/149446 | A1 | 8/2018 |
| WO | WO 2018/224081 | A1 | 12/2018 |
| WO | WO 2023/147801 | A1 | 8/2023 |

OTHER PUBLICATIONS

All About Circuits, What is the Difference Between Series and Parallel Circuits?,vol. Direct Current (DC), Chapter 5, Series and Parallel Circuits, obtained on Sep. 13, 2024.*

* cited by examiner

MAGNETIC SENSING DEVICE

FIELD OF THE INVENTION

The present disclosure relates to a magnetic sensing device and method of use. In particular, the present disclosure relates to a magnetic sensing device that implements a quadrant detector.

BACKGROUND

Magnetic angle sensors such as magnetoresistive (MR) sensors are used to sense external rotating magnetic fields by detecting a change in resistance of the sensor as a result of the external magnetic field. Such sensors are commonly used in applications where there is a need to monitor the precise angular position of a rotating device or system, such as a motor. In this respect, the rotating device is provided with a magnet, the magnetoresistive sensor measuring the field angle of the rotating magnetic field, which is then translated to an angular position of the device being monitored.

SUMMARY OF THE DISCLOSURE

The present disclosure provides a method of providing quadrant information to a magnetic sensing device comprising a magnetic angle sensor, and in particular, a magnetic angle sensor configured to provide 180° absolute angle measurements, such as a 180° anisotropic magnetoresistive (AMR) angle sensor, such that the magnetic sensing device outputs an analog signal encoded with 360° information. In this respect, magnetic sensing device is provided with a magnetic angle sensor and a quadrant detector, which may be provided on the same substrate or two separate substrates, wherein the signal from the quadrant detector is encoded into the analog sine and cosine voltage outputs from the magnetic angle sensor such that the two analog outputs provide 360° angle information.

A first aspect of the present disclosure provides a magnetic sensing device, comprising an angle sensor configured to detect an orientation of a rotating magnetic field, the angle sensor being configured to measure 180 degrees of rotation, and a quadrant detector being configured to detect a quadrant of a magnetic field angle of the rotating magnetic field, wherein the magnetic sensing device is configured to output a signal comprising an output of the angle sensor encoded with an output of the quadrant detector.

The angle sensor is configured to provide absolute 180° information. In some aspects, it is only capable of measuring the rotation of the magnetic system up to 180°, and will start recounting after each 180°. Such a sensor typically provides a more precise and robust angle measurement; however, it is not possible to distinguish between the first and second half turn based on that measurement alone. By combining the signal of the angle sensor with the signal of quadrant detector, an output that has complete 360° information can be provided that requires two less electrical leads, thereby reducing the complexity and cost of installing the magnetic sensing device within an external system.

The output of the angle sensor may comprise a pair of voltage outputs. For example, the pair of voltage outputs may comprise a sine voltage and a cosine voltage.

The magnetic sensing device may further comprise a quadrant logic arrangement for processing voltages output from the quadrant detector, the quadrant logic arrangement outputting a signal indicative of the quadrant of the magnetic field in dependence thereon.

The quadrant logic arrangement may comprise at least two comparators. For example, the comparators of the quadrant logic arrangement may be configured to encode the detected quadrant as a sequence of 0 and 1 values.

The signal indicative of the quadrant may be used to modulate the pair of voltage outputs output by the angle sensor.

For example, a first voltage output of the angle sensor may be modulated in dependence on a signal indicative of a first quadrant or a second quadrant, the first voltage output being modulated by different amounts for each of the first and second quadrants.

Similarly, a second voltage output of the angle sensor may be modulated in dependence on a signal indicative of a third quadrant or a fourth quadrant, the second voltage output being modulated by different amounts for each of the third and fourth quadrants.

The signal output by the magnetic sensing device may comprise the signal indicative of the quadrant and the pair of voltage outputs output by the angle sensor, wherein the signal indicative of the quadrant is output at a first time, and the pair of voltage outputs are output at a second time, the first time being before the second time.

The magnetic sensing device may further comprise a plurality of switches for modifying the signal output by the magnetic sensing device in dependence on the signal indicative of the quadrant, wherein one the plurality of switches is turned on at the first time.

The magnetic sensing device may further comprise a logic gate arrangement for outputting the signal indicative of the quadrant at the first time.

In some arrangements, the signal indicative of the quadrant may be used to modulate a drive voltage applied to the angle sensor, wherein a different drive voltage is applied for each quadrant.

In some cases, a sequence of drive voltages may be repeatedly applied to the angle sensor based on a plurality of signals output by the quadrant detector and the signal indicative of the quadrant.

The sequence of drive voltages may have a higher frequency than a rotation frequency of the magnetic field.

The magnetic sensing device may further comprise a clock for controlling the frequency of the sequence of drive voltages.

The magnetic sensing device may further comprise a bridge driver, wherein the signal indicative of the quadrant is input to the bridge driver.

The angle sensor may be an anisotropic magnetoresistive (AMR) based angle sensor.

The quadrant detector may be an anisotropic magnetoresistive (AMR) based quadrant detector.

The magnetic sensing device may further comprise a sensor package for housing the angle sensor and the quadrant detector.

BRIEF DESCRIPTION OF THE DRAWINGS

The present disclosure will now be described by way of example with reference to the accompanying drawings in which.

DETAILED DESCRIPTION

Figure 2A:
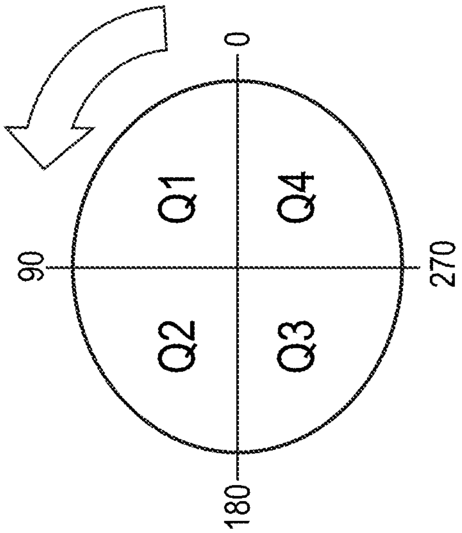
FIGS. 2A-2B are graphs illustrating output signals of the magnetic sensing device of FIG. 1.
Figure 2B:
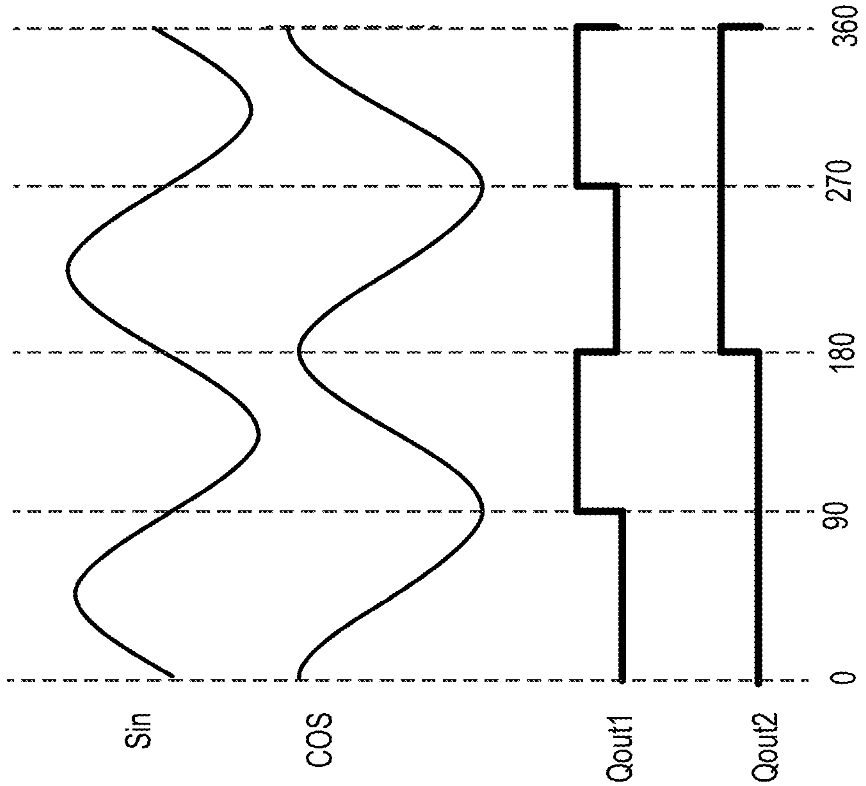

Magnetic angle sensors, such as anisotropic-magnetoresistive (AMR) sensors and other magnetoresistive sensors, are commonly used to sense external magnetic fields by detecting a change in resistance of the sensor as a result of the external magnetic field. As the magnetic field rotates, the change in field angle of the rotating magnetic field is measured, which can thus be translated to an angular position of a device or system that is causing the magnetic field to rotate, for example, a motor. Angle sensors providing 180° absolute angle information, such as a 180° AMR-based angle sensor, are typically more robust and precise than those providing 360° angle information. However, this means that the angle sensor repeats the same output twice over 360° of rotation. That is to say, it provides the same signal output for 0° to 180° of rotation as it does for 180° to 360° of rotation. A 180° AMR sensor, as an example, provides two voltage outputs; one with a sine waveform and one with a cosine waveform, with both waveforms repeating every 180° of rotation, as shown by FIG. 2B. As a result, it is not possible to differentiate between the first half turn and the second half turn. For example, the voltage output at 5° will be the same as at 185°.

Consequently, it is advantageous to provide quadrant information so that the output of angle sensor can be mapped to the correct angular position within either the first 180° of rotation or the second 180° of rotation. Quadrant information can be measured using a quadrant detector, which may be in the form of any suitable magnetic field sensor. For example, the quadrant detector may be in the form of four magnetoresistive sensor elements connected in a bridge configuration. Examples of magnetoresistive quadrant detectors are described in US Publication No. 2017/0276514 and U.S. Pat. No. 9,310,446. Typically, the signal from the quadrant detector is output separately to that of the 180° angle sensor, converted to a digital signal and then combined with the angle sensor output in the digital domain. However, this typically means that the magnetic sensing device has at least six connection leads; a voltage supply, ground, two voltage outputs for the angle sensor and two voltage outputs for the quadrant detectors. This therefore adds to the complexity and cost of installing the magnetic sensing device within an external system.

Figure 1:
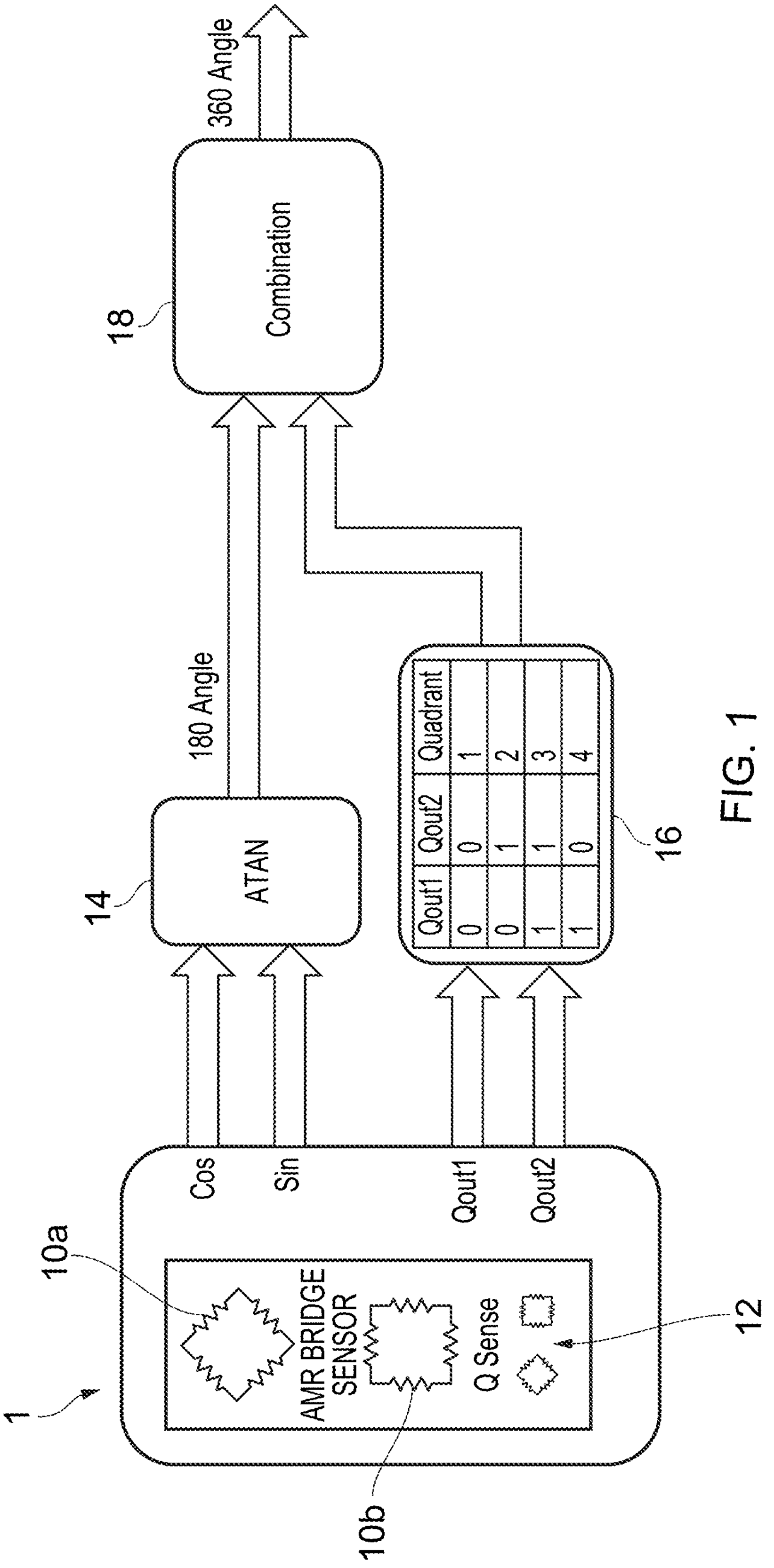
FIG. 1 is a flow diagram illustrating operation of a magnetic sensing device.

As shown in FIG. 1, a magnetic sensing device 1 is provided comprising an AMR angle sensor and a quadrant detector. The AMR angle sensor comprises a first bridge sensor 10*a* configured to output a cosine voltage output and a second bridge sensor 10*b*, rotated by 45° relative to the first bridge sensor 10*a* and configured to output a sine voltage output, as illustrated by FIG. 2B. The arctan 14 of the sine and cosine voltage outputs is calculated to provide the field angle of the external magnetic field. The quadrant detector 12 also comprises two bridge circuits rotated 90° relative to each other, the voltage output of the two sensors being encoded as a sequence 16 of 0 and 1 values depending on the quadrant through which the magnetic field is rotating (shown by way of example in FIGS. 2A and 2B). In this example, both quadrant outputs are 0 in Q1 (i.e. 0° to 90°), the first output is 0 and the second output is 1 in Q2 (i.e. 90° to 180°), both outputs are 1 in Q3 (i.e. 180° to 270°) and the first output is 1 and the second output is 0 in Q4 (i.e. 270° to 360°). In this example, the quadrant detector output is output as a separate analog signal, digitized and then combined 18 with the calculated 180° angle to determine the 360° angle information.

The present disclosure thus provides a magnetic sensing device comprising a magnetoresistive angle sensor configured to output 180° absolute angle information and a magnetic quadrant detector, wherein the quadrant information is encoded into the analog outputs of the magnetoresistive angle sensor such that 360° information can be derived therefrom.

Figure 3:
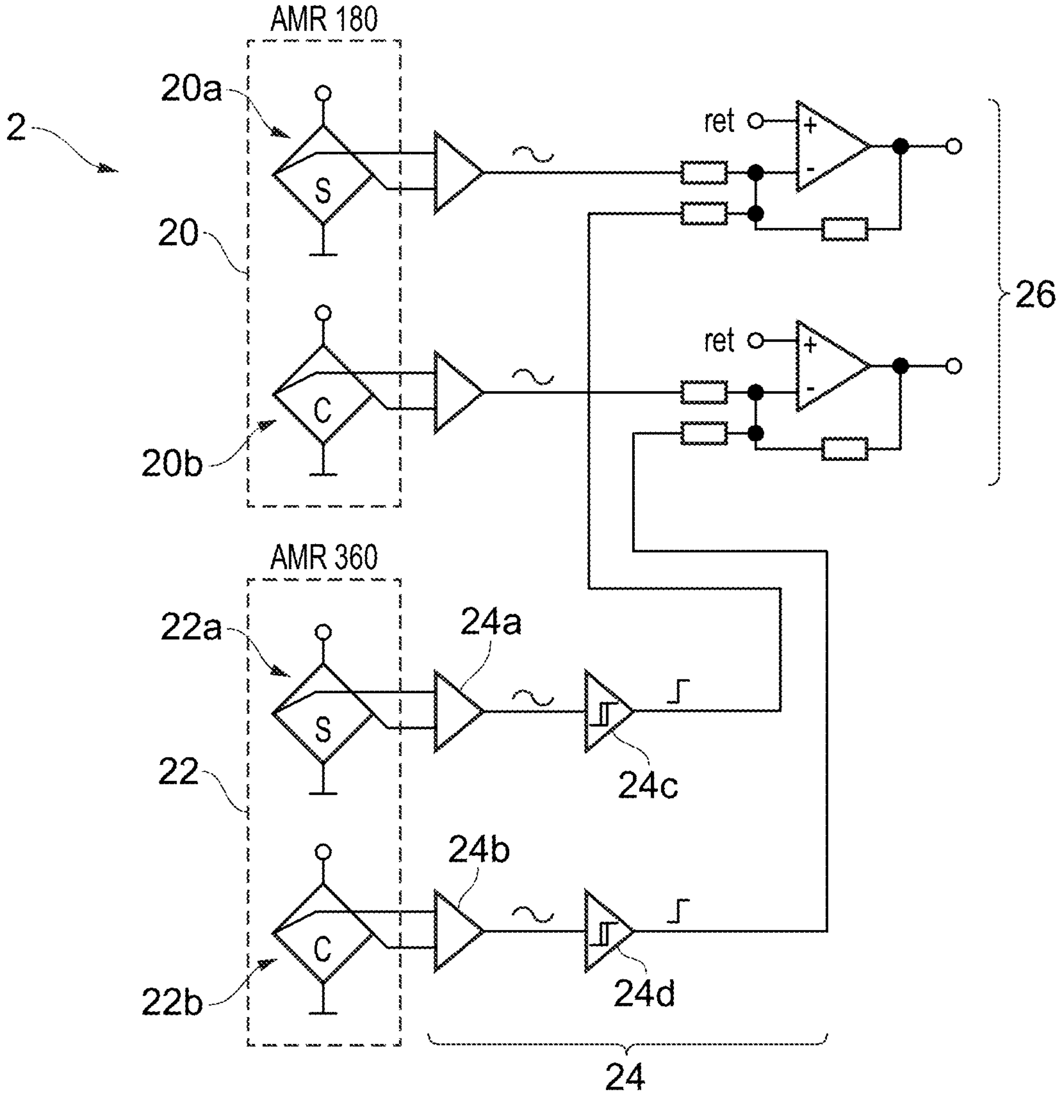
FIG. 3 is a circuit diagram illustrating components of a magnetic sensing device in accordance with a first embodiment of the disclosure.
Figure 4:
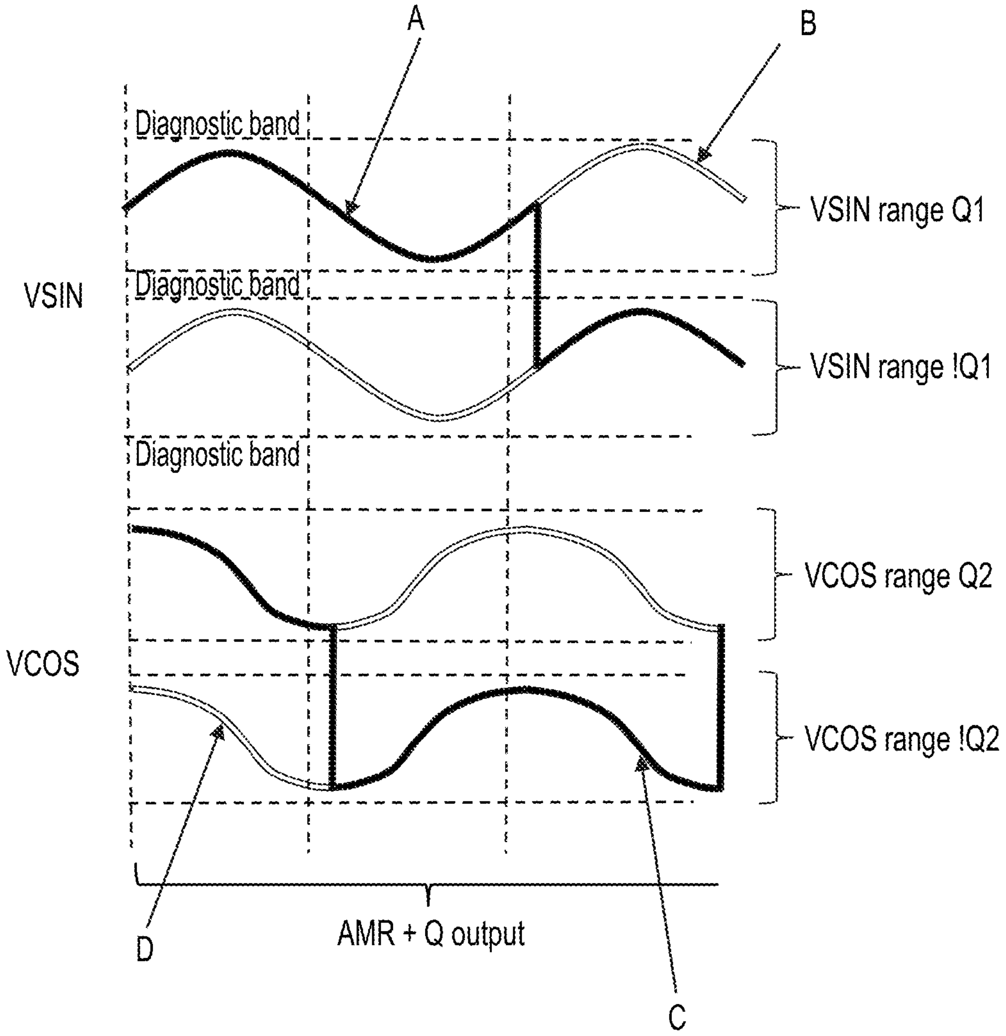
FIG. 4 is a graph illustrating the analog output signal of a magnetic sensing device in accordance with the first embodiment of the disclosure.
Figure 5:
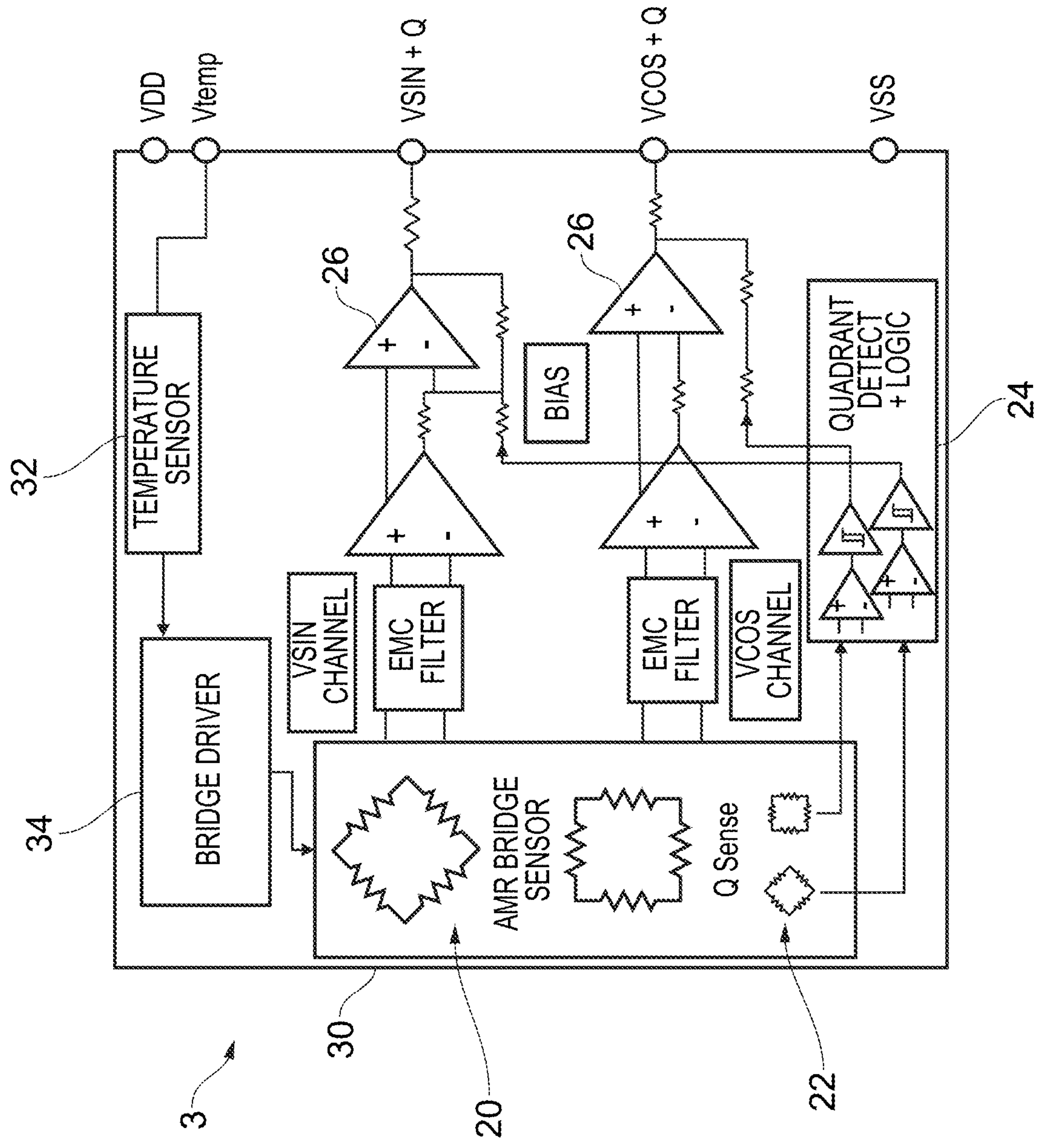
FIG. 5 illustrates a magnetic sensing device in accordance with the first embodiment of the disclosure.

FIGS. 3 to 5 illustrate a magnetic sensing device in accordance with a first embodiment of the present disclosure, in which the analog signal from the quadrant detector is combined with the analog signal from the angle sensor to provide an analog 360° angle output, for example, by modulating the common mode of the angle sensor response.

FIG. 3 is an example circuit diagram 2 showing one or more components of a magnetic sensing device in accordance with the first embodiment of the present disclosure. As before, the magnetic sensing device comprises a 180° AMR angle sensor 20 and a quadrant detector 22 similar to those described above with reference to FIG. 1, the quadrant detector 22 in this example being provided as a 360° AMR sensor. As before, the 180° AMR angle sensor 20 comprises two bridge circuits 20*a*, 20*b* that are configured to output sine and cosine voltage outputs respectively, the amplitude of which is reduced, for example, by approximately half. The quadrant detector 22 also comprises two bridge circuits 22*a*, 22*b* that output a sine and cosine voltage respectively, which are passed through a detection logic arrangement 24 comprising a pair of operational amplifiers 24*a*, 24*b* and at least two comparators 24*c*, 24*d* to encode the detected quadrant as the sequence of 0 and 1 (corresponding to a low or high output), as described above. It will of course be appreciated that the detection logic arrangement 24 may also comprise an additional comparator (not shown), for example, for use in detecting an invalid state. Preferably, the comparators 24*c*, 24*d* will be configured to exhibit a small hysteresis to avoid high levels of noise at the point at which the signal switches between the low and high output. If no hysteresis is present and the input voltage is exactly at the point where the operational amplifier switches, the output will continuously switch between high and low as a result of the unavoidable input noise, and so some hysteresis is needed to counter this. The output of the quadrant detector 22 is then used to modulate the common mode of the angle sensor 20, by means of a pair of operational amplifiers 26, depending on the detected quadrant, such that it switches the reduced sine and cosine outputs between the top half and the bottom half of the signal range.

For example, as shown in FIG. 4, the first quadrant detector output is used to modulate the sine voltage output (denoted by arrow A) such that it switches between the top half to the bottom half of the normal signal range (denoted by arrow B). Similarly, the second quadrant output is used to module the cosine voltage output (denoted by arrow C) such that it switches between the top half to the bottom half of the normal signal range (denoted by arrow D). In both cases, a central diagnostic band is needed to distinguish between the minimum sine or cosine signal when the respective quadrant detector output is high and the maximum sine or cosine signal when the respective quadrant detector output is low. Consequently, when the analog outputs are converted to digital, enough information is encoded within the analog outputs to provide 360° angle information.

FIG. 5 illustrates a magnetic sensing device 3 in accordance with the first embodiment of the present disclosure, which comprises similar circuitry as that described with reference to FIG. 3, all shown here as being formed on a single substrate 30. In this example, the 180° angle sensor 20 and the quadrant detector 22 are formed on the same die, which is formed onto the substrate 30. However, it will of course be appreciated that that the angle sensor 20 and the quadrant detector 22 may be formed on the same die or separate dies, and that these may or may not be formed on the same application specific integrated circuit (ASIC) as the remaining signal processing circuitry. In the example, the magnetic sensing device 3 also comprises a temperature sensor 32 and a bridge driver 34 for controlling the amplitude of the angle sensor 34. In this example, the temperature sensor 32 is used adjust the bridge drive voltage in order to temperature compensate for the temperature coefficient of the angle sensor 20. It will, however, be appreciated that the temperature sensor information may be output directly and used to temperature compensate in some other post processing.

FIGS. 6 to 10 illustrate a magnetic sensing device and its operation in accordance with a second embodiment of the present disclosure, in which the signal from the quadrant detector is output before the analog signal of the angle sensor begins to thereby provide a starting point for the 180° angle information. Once the starting point is known, it is possible to work out where the magnetic field is within the 360° rotation each time the sine and cosine output voltage repeats.

Figure 6:
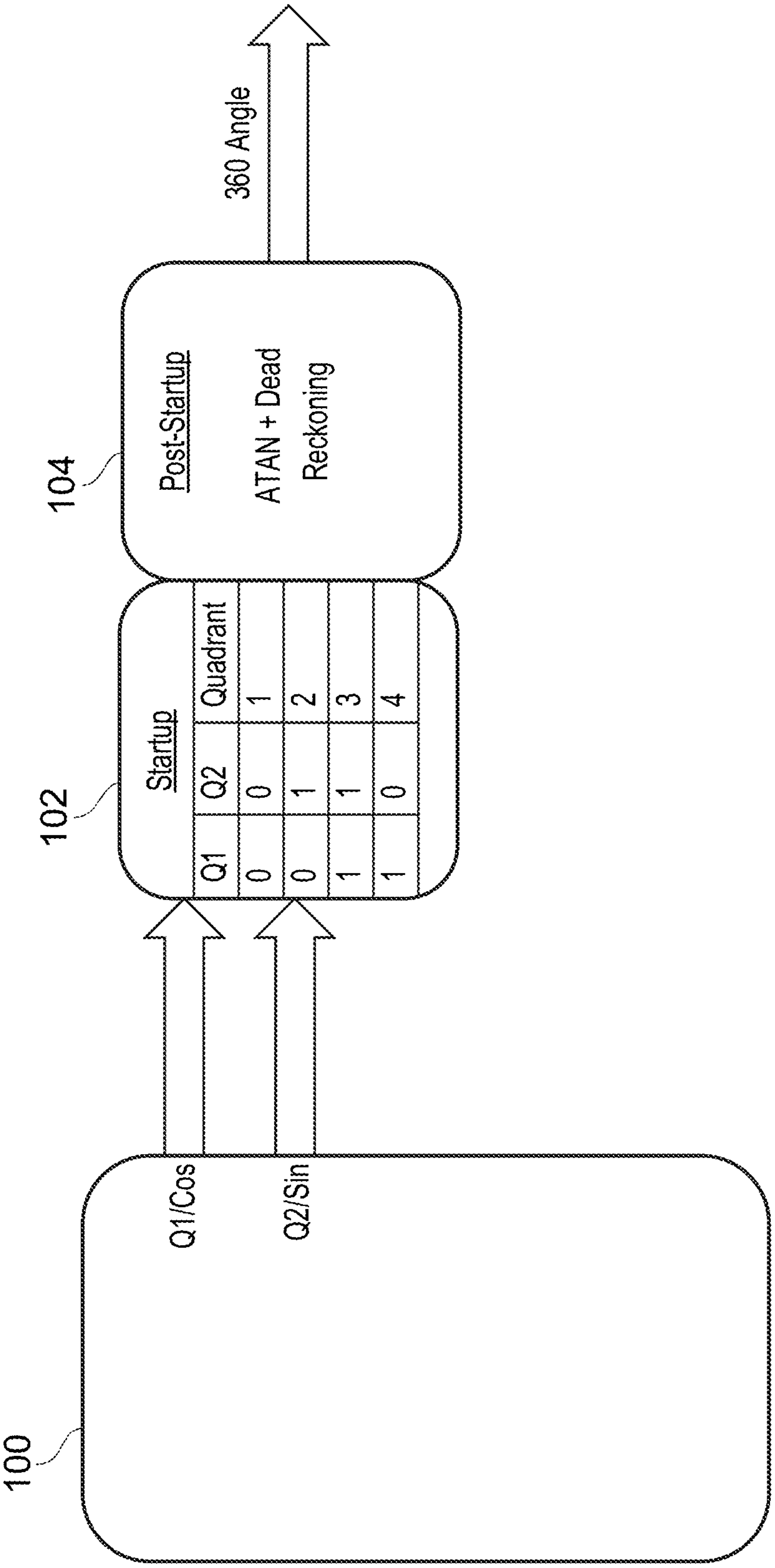
FIG. 6 is a flow diagram illustrating the operation of a magnetic sensing device in accordance with a second embodiment of the disclosure.
Figure 7A:
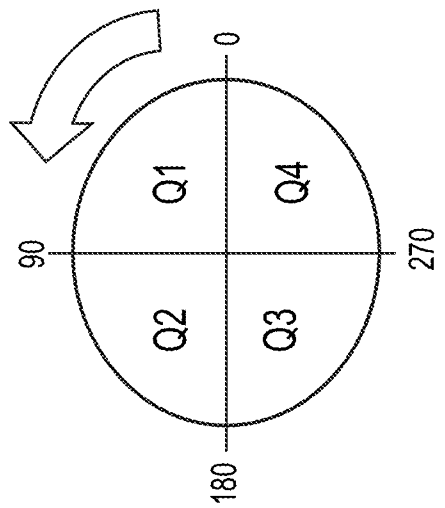
FIGS. 7A-7B are graphs illustrating output signals of a magnetic sensing device in accordance with the second embodiment of the disclosure.
Figure 7B:
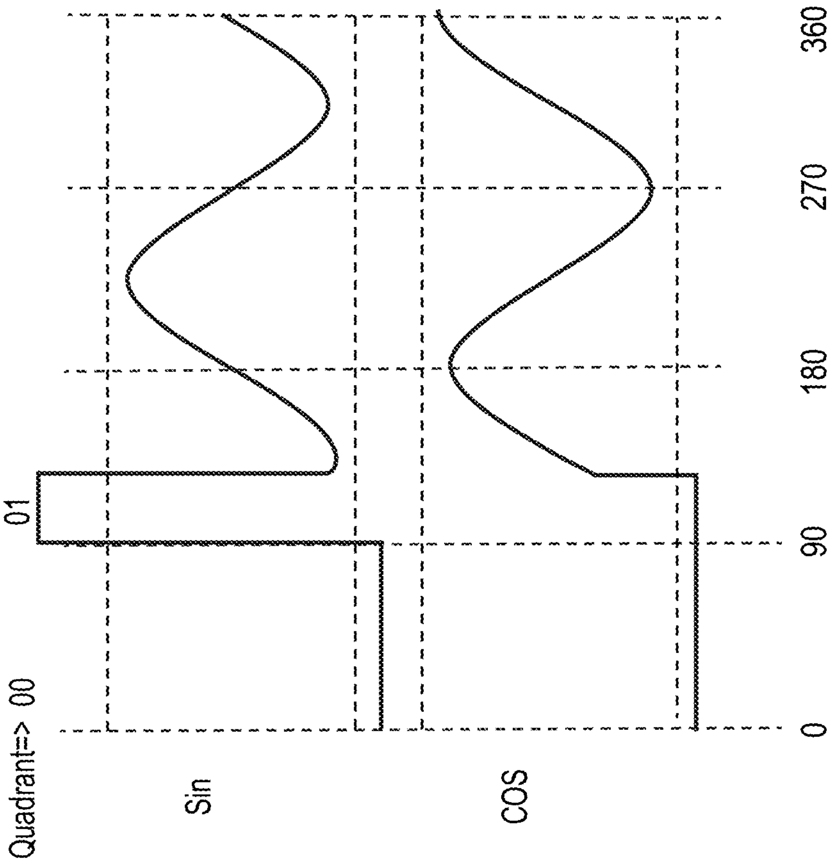

As illustrated by FIG. 6, the quadrant detector outputs 100 are encoded at start-up 102 into a sequence of 0 and 1, and this is used post start-up 104 to dead reckon the angle sensor output, from which the 360° angle information can be derived. For example, as shown in FIGS. 7A-7B, if the quadrant detector output is 01 (i.e., the first quadrant detector output is 0 and the second quadrant detector output is 1 such that the magnetic field is in quadrant 2), when the angle sensor is switched on, the measured angle starts counting from Q2. As such, when the external magnetic field rotates through 180° such that the sine and cosine outputs start again, it can be deduced that the magnetic field is now in Q4 based on the fact it started in Q2.

Figure 8:
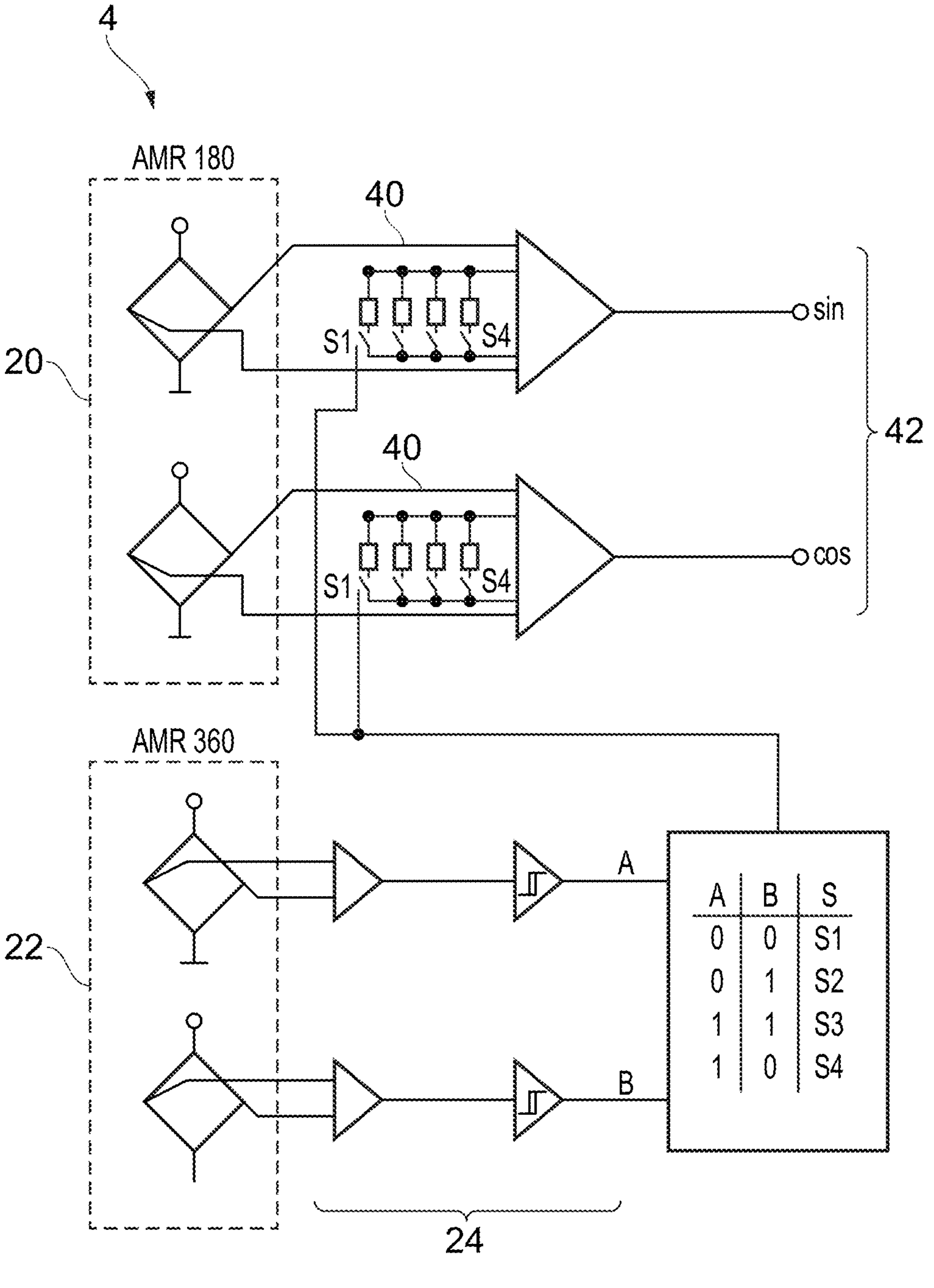
FIG. 8 is a circuit diagram illustrating components of a magnetic sensing device in accordance with the second embodiment of the disclosure.

FIG. 8 is an example circuit diagram 4 showing one or more components of a magnetic sensing device in accordance with the second embodiment of the present disclosure. The components of the magnetic sensing device are similar to those shown in FIG. 2, however, in this example a plurality of switches 40 are provided before a pair of operational amplifiers 42 in order to switch between the possible outputs of the quadrant detector 22, S1 to S4, such that the signal output via the operational amplifiers 42 varies between different quadrants. In this respect, the outputs of the quadrant detector 22 will be output via the operational amplifiers 42 first to provide the starting point, and then the outputs of the 180° angle sensor 20 will be provided to start measuring the rotation of the magnetic field based on the measured starting point, as illustrated further by the graph shown in FIG. 10.

Figure 9:
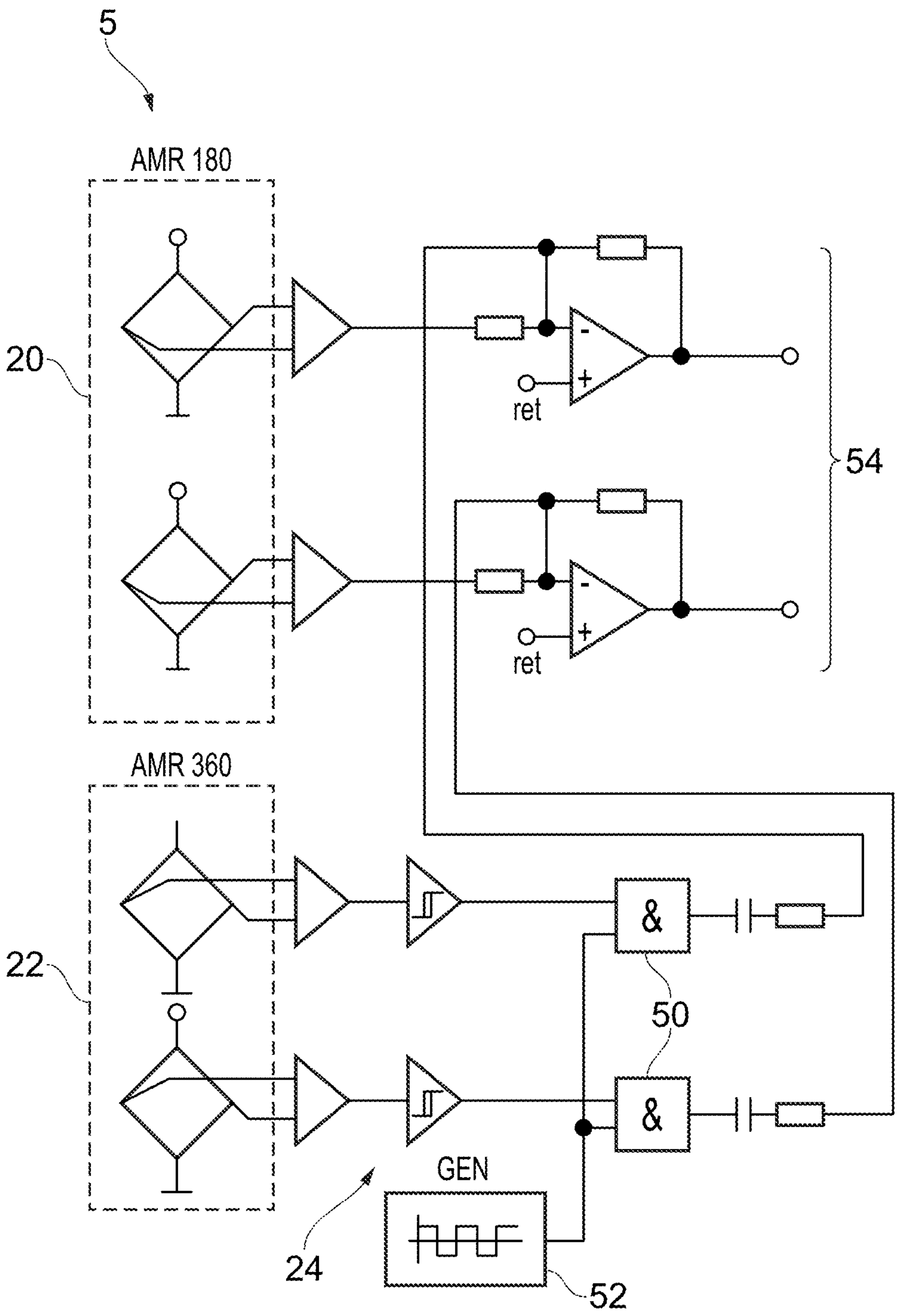
FIG. 9 is a further circuit diagram illustrating components of a magnetic sensing device in accordance with the second embodiment of the disclosure.
Figure 10:
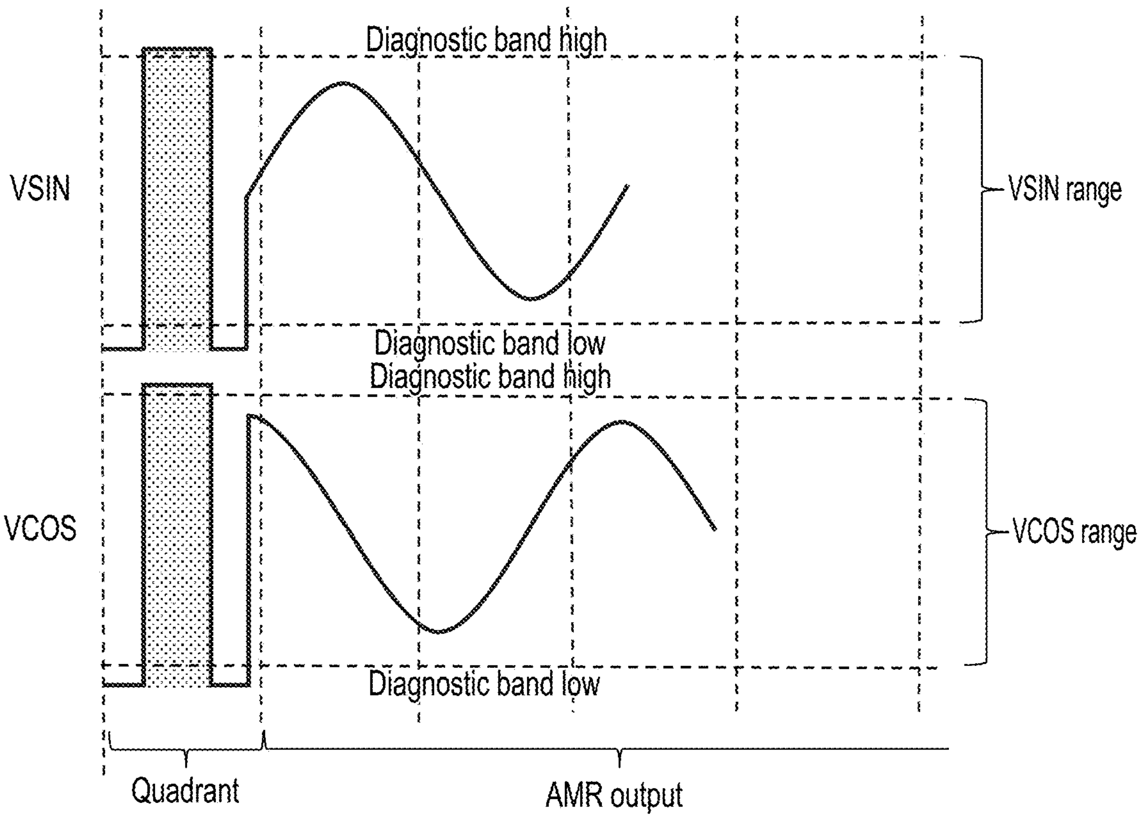
FIG. 10 is a graph illustrating the analog output signal of a magnetic sensing device in accordance with the second embodiment of the disclosure.

FIG. 9 is a further example circuit diagram 5 showing one or more components of a magnetic sensing device in accordance with the second embodiment of the present disclosure. The components of the magnetic sensing device are similar to those shown in FIG. 8, however, in this example a pair of AND gates 50 are provided that are configured to output the signals of the quadrant detector 22 to the operational amplifiers 54 based on the signal of a frequency generator 52. For example, at start-up, a high frequency is output by the generator 52 such that the AND gates 50 open and the quadrant information is output. The AND gates 50 are then shut off, such that the outputs from the 180° AMR sensor 20 is output to the operational amplifiers 54.

Figure 11:
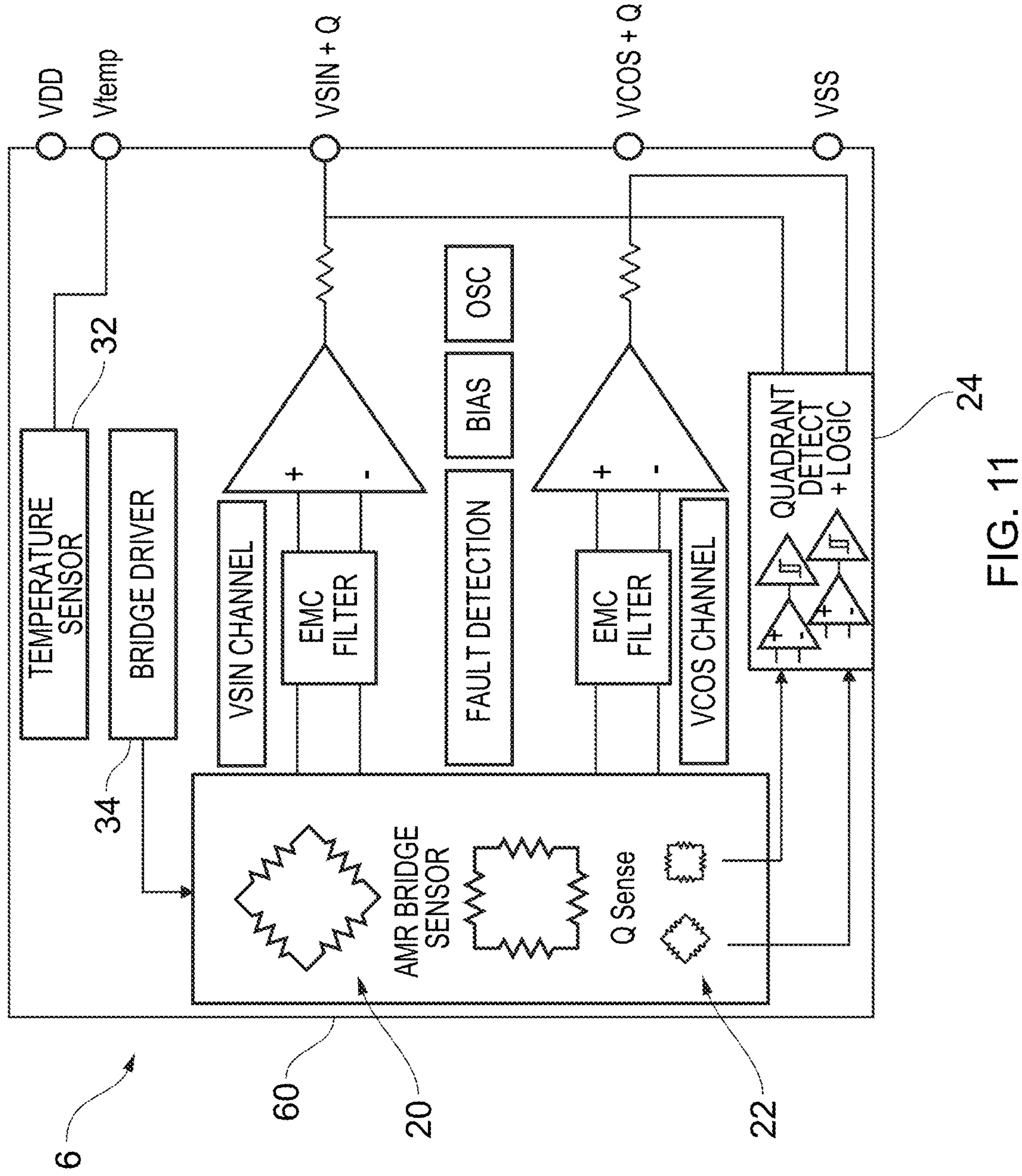
FIG. 11 illustrates a magnetic sensing device in accordance with the second embodiment of the disclosure.

FIG. 11 illustrates a magnetic sensing device 6 in accordance with the second embodiment of the present disclosure, the components of which are similar to that of FIG. 5, and which may further comprise the circuitry described with reference to FIG. 8 or 9, formed on a substrate 60. In this example, the quadrant detection logic 24 (i.e. two operational amplifiers and a pair of comparators) is shown as being connected directly to the analog outputs of the AMR angle sensor 20, however, it will be appreciated that this may be replaced by the specific arrangements described with reference to FIGS. 8 and 9 for switching between the quadrant detector signal and the AMR angle signal.

FIGS. 12 to 17 illustrate a magnetic sensing device in accordance with a third embodiment of the present disclosure, in which the signal from the quadrant detector 22 is used to modulate the bridge drive of the AMR angle sensor 20 such that the amplitudes of the sine and cosine signals are modified for each quadrant. In this respect, the amplitude of the sine and cosine signals does not affect the measured angle, but it does change the radius of the signal calculated by:

$$\sqrt{V_{Sine}^2 + V_{Cosine}^2} \quad [1]$$

As such, by calculating the radius of the sine and cosine signals, the quadrant can be deduced and used to determine the 360° angle information.

Figure 12:
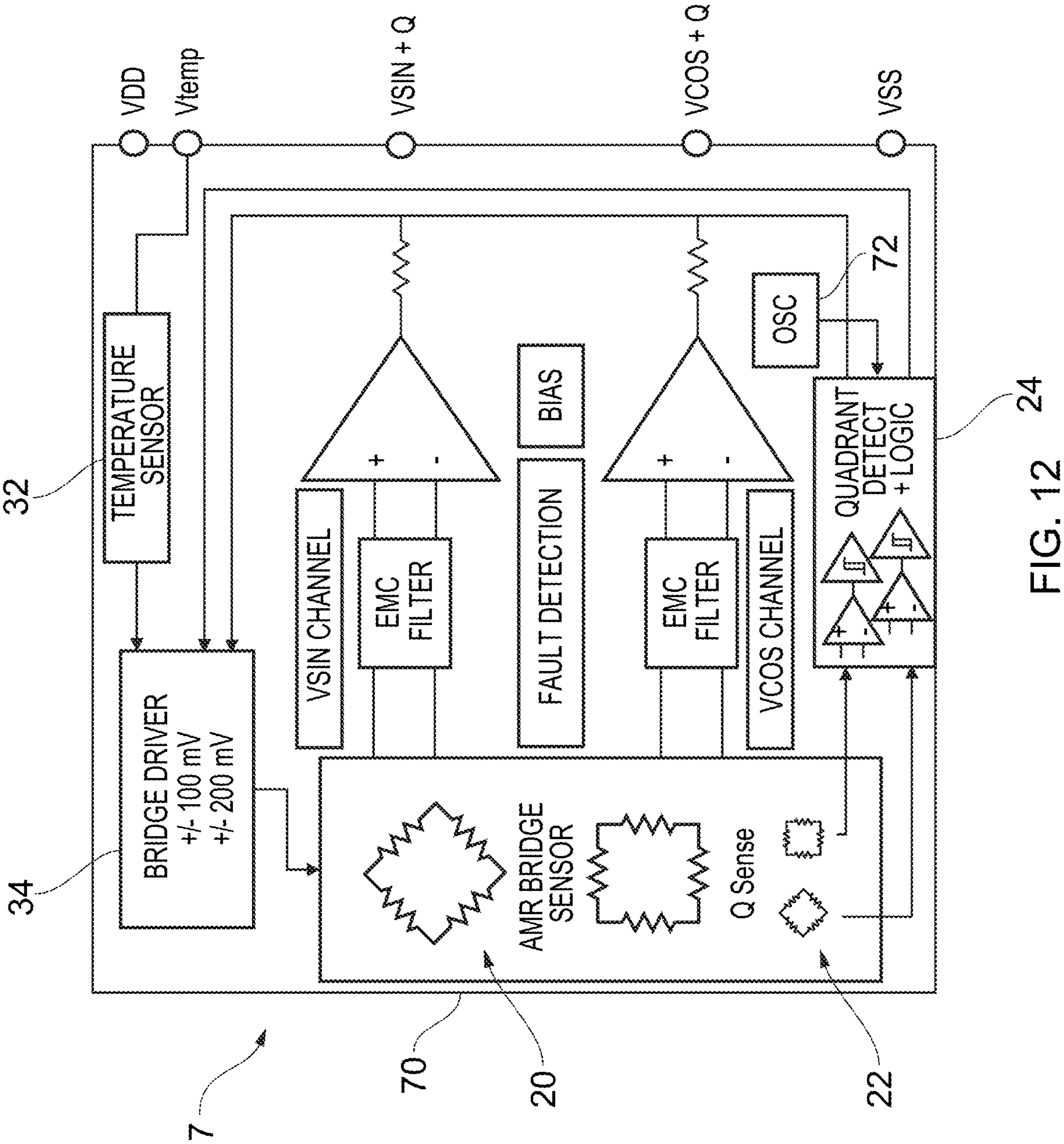
FIG. 12 illustrates a magnetic sensing device in accordance with a third embodiment of the disclosure.

FIG. 12 illustrates a magnetic sensing device 7 in accordance with the third embodiment of the present disclosure, the components of which are similar to that of FIGS. 5 and 11, formed on a substrate 70. However, in this example, the output of the quadrant detector 22 is fed into the bridge driver 34 used to modify the amplitude of the AMR angle sensor 20 in dependence on the detected quadrant. For example, for an output indicating Q1, the bridge driver 34 moves the drive signal down 200 mV; for an output indicating Q2, the bridge driver 34 moves the drive signal down 100 mV; for an output indicating Q3, the bridge driver 34 moves the drive signal up 100 mV; and for an output indicating Q4, the bridge driver 34 moves the drive signal up 200 mV. It will of course be appreciated that the bridge driver 34 may modulate the drive signal by any suitable amount.

Figure 13:
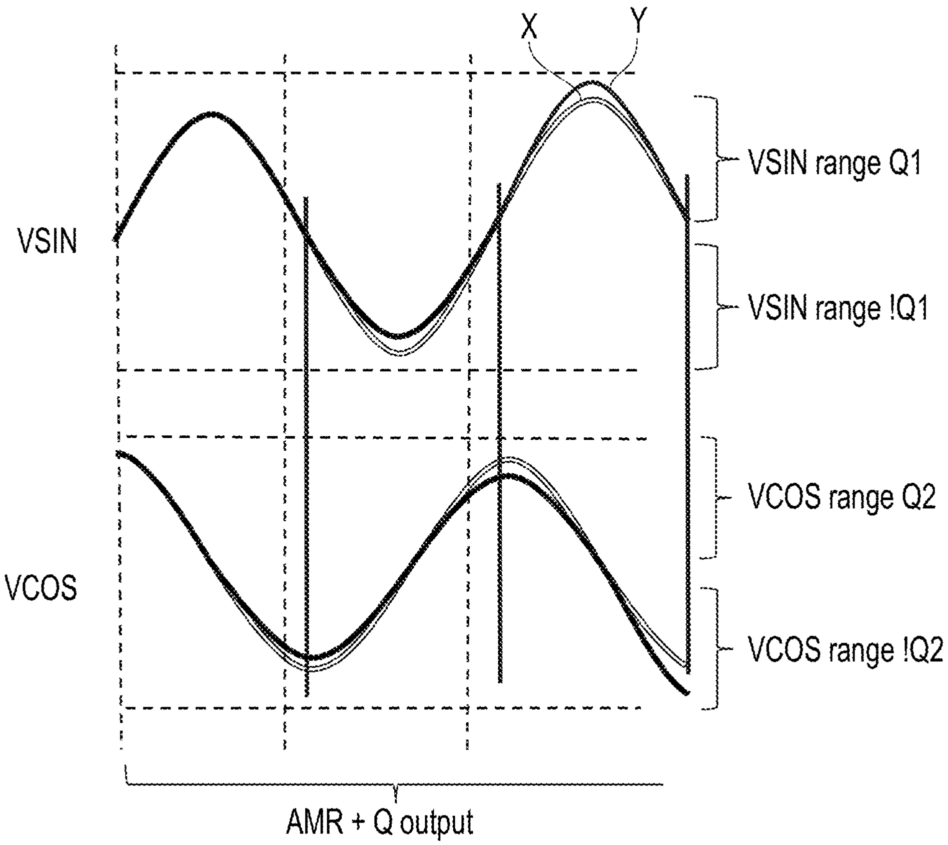
FIG. 13 is a graph illustrating the analog output signal of a magnetic sensing device in accordance with the third embodiment of the disclosure.
Figure 14:
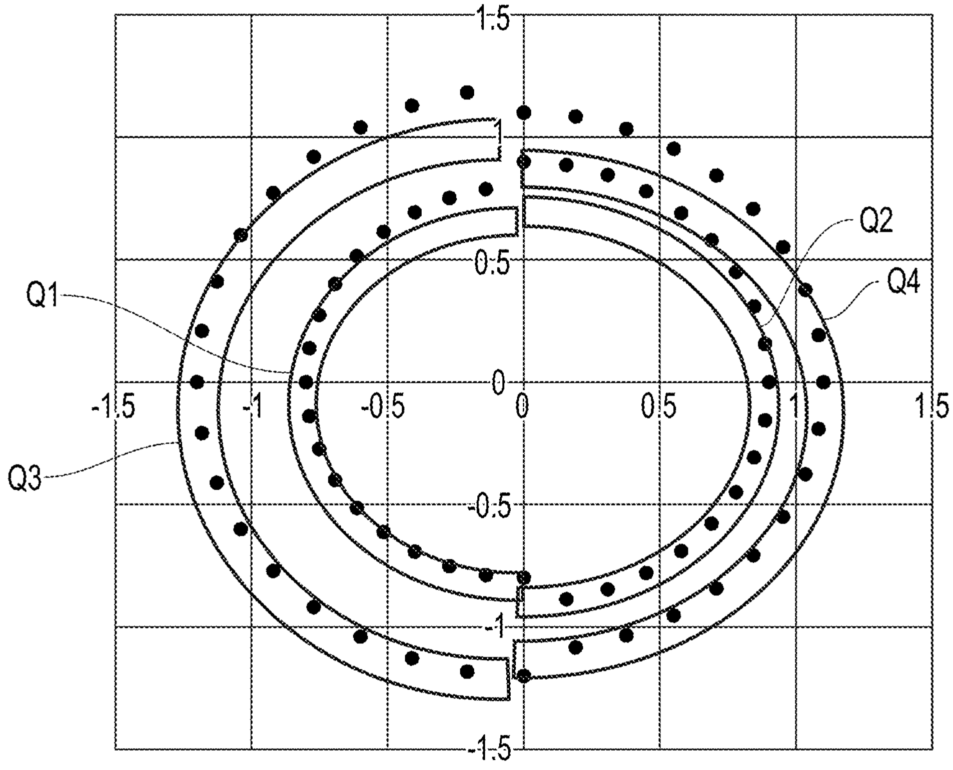
FIG. 14 is a graph further illustrating the analog output signal of a magnetic sensing device in accordance with the third embodiment of the disclosure.

As can be seen from FIG. 13, this does not have a significant effect on the sine and cosine signal, with the normal signal being denoted by arrow X and the modified signal being denoted by arrow Y. However, as illustrated by FIG. 14, the radius of the sine and cosine signal does change as the amplitude is modified based on the detected quadrant, with the detected signal being different for each quadrant.

In some examples, the frequency at which the quadrant signal is modulated onto the bridge drive is varied based on the speed of rotation, in order to reduce harmonic issues caused by variations in temperature (due to variations in rotation speed) that can result in an angle error.

Figure 15:
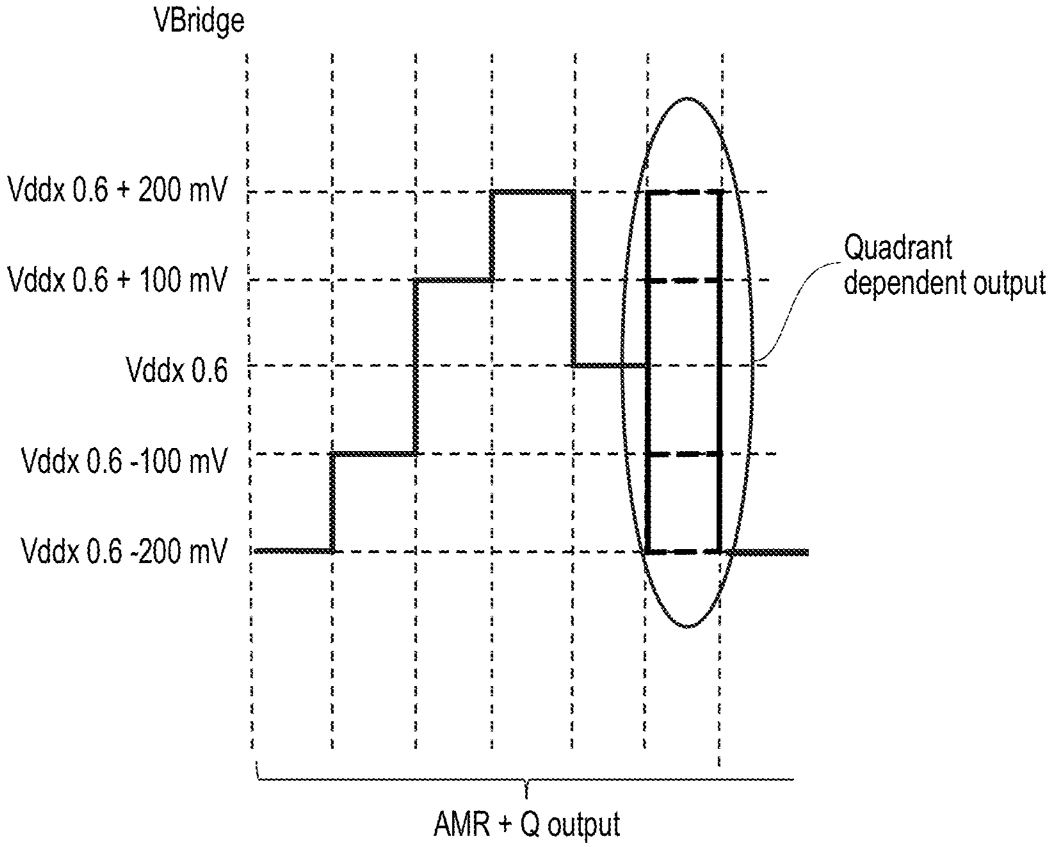
FIG. 15 is a graph further illustrating the analog output signal of a magnetic sensing device in accordance with the third embodiment of the disclosure.

In this respect, as shown further in FIG. 12, the detection logic arrangement 24 may also comprise a clock 72. The clock 72 controls a sequencer such that the quadrant detector outputs are switched through a sequence of bridge drive output voltages. For example, the sequence may be: (1) the output corresponding to Q1, (2) the output corresponding to Q2, (3) the output corresponding to Q3, (4) the output corresponding to Q4, (5) the output corresponding to no quadrant detection signal, and (6) the output corresponding to the actual quadrant measurement at that moment in time. An example of this is illustrated by FIG. 15, which shows how the bridge drive voltage is switched through a sequence of: −200 mV (Q1), −100 mV (Q2), +100 mV (Q3), +200 Mv (Q4), ±0 mV, and then the bridge drive voltage corresponding to whatever quadrant the magnetic field angle is in at that moment in time. The sequence will then be continuously repeated, with the initial four steps acting as a reference for the actual quadrant measurement. The rate of sequencing may be at the rate of the clock signal output by the clock 72, or a divided down rate, such that the system can sample the analog outputs and calculate the radius quickly enough to determine the 360° angle information.

Furthermore, as the quadrant is being sampled at a higher frequency than the rotation of the magnetic field (and thus whatever is driving the magnet), the quadrant signal and the main angle sensor signal separate in the frequency domain. As such, the analog signal output from the magnetic sensor can be frequency filtered to determine the quadrant.

Figure 16:
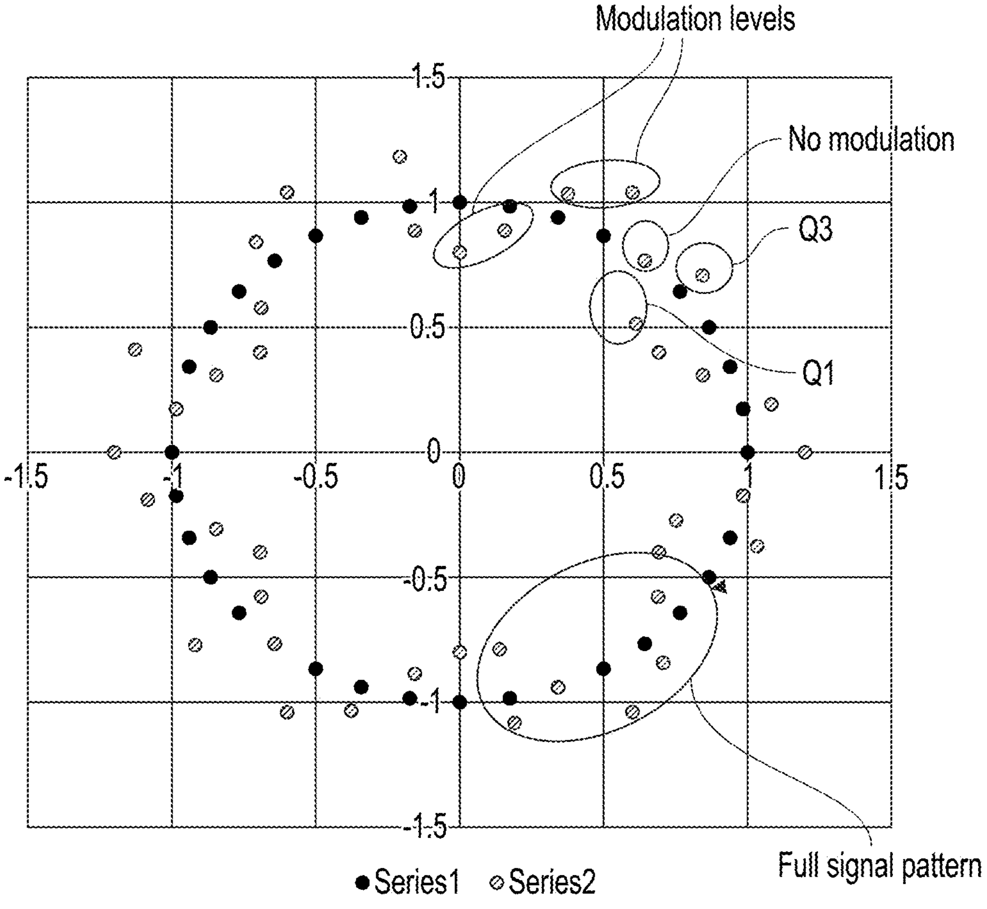
FIG. 16 is a graph further illustrating the analog output signal of a magnetic sensing device in accordance with the third embodiment of the disclosure.
Figure 17:
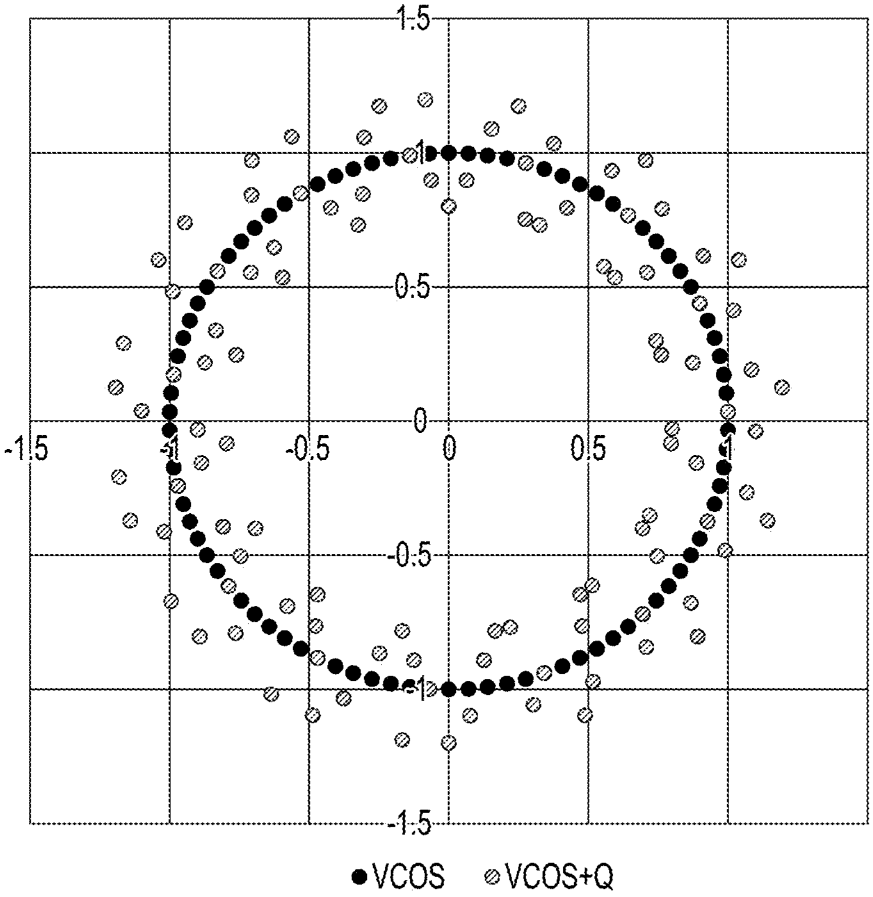
FIG. 17 is a further graph illustrating the analog output signal of a magnetic sensing device in accordance with the third embodiment of the disclosure.

FIGS. 16 and 17 illustrate how the radius of the sine and cosine signal varies using this sequencing method. As can be seen from FIG. 16, the resulting radius follows the same pattern of the four reference modulation levels, no modulation and then the actual quadrant measurement. In FIG. 17, the magnetic field is rotating at a slower frequency, and thus the sequencing is also performed at a lower rate, resulting in more repetitions of the pattern.

The sequencing through Q1-Q4 by the clock 71 may be performed at the outputs of the detection logic arrangement 24. Alternatively, the clock signal may be provided at the input of the detection logic arrangement 24. In doing so, the clock 72 causes the comparators of the detection logic arrangement 24 to switch between the four quadrant signals, which in turn helps to verify that the components of the detection logic arrangement (i.e. the amplifiers and the comparators) are working properly.

Figure 18:
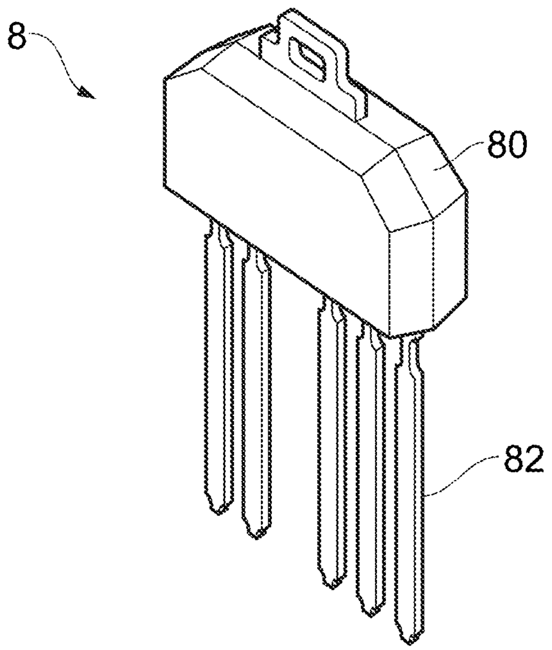
FIG. 18 illustrates a magnetic sensing device in accordance with the embodiments of the disclosure.

FIG. 18 illustrates an example of a magnetic sensing device 8 according to the embodiments of the disclosure. Here, the magnetic sensing components and circuitry are housed within a sensor package 80 with electrical leads 82 extending therefrom. The electrical leads 82 correspond to a voltage supply, ground, the two angle sensor voltage outputs, and optionally, a temperature sensor output. As such, by encoding the signal from the quadrant detector into that of the angle sensor in some way, as described above, the magnetic sensing device 8 requires two less electrical leads extending from the package 80.

Various modifications, whether by way of addition, deletion and/or substitution, may be made to all of the above described embodiments to provide further embodiments, any and/or all of which are intended to be encompassed by the appended aspects.

Whilst the examples described above implement a 360° AMR based quadrant detector, it will of course be appreciated that any suitable magnetic quadrant detector may be used, for example, a giant magnetoresistive (GMR) or tunnel magnetoresistive (TMR) based quadrant detector, or a Hall sensor.

The invention claimed is:

1. A magnetic sensing device, comprising:

an angle sensor being configured to detect an orientation of a magnetic field, the angle sensor being configured to measure 180 degrees of rotation of the magnetic field;

a quadrant detector being configured to detect a quadrant of a magnetic field angle of the magnetic field;

a pair of operational amplifiers, each operational amplifier being configured to output a signal comprising an output of the angle sensor; and control circuitry coupled to the pair of operational amplifiers and being configured to modify the signals output by each operational amplifier of the pair of operational amplifiers to be indicative of only the quadrant of the magnetic field angle during an initial period prior to the pair of operational amplifiers outputting the signals comprising only the output of the angle sensor.

2. The magnetic sensing device according to claim 1, wherein the output of the angle sensor comprises a pair of voltage outputs.

3. The magnetic sensing device according to claim 2, wherein the pair of voltage outputs comprise a sine voltage and a cosine voltage.

4. The magnetic sensing device according to claim 2, further comprising a quadrant logic arrangement for processing the voltage output from the quadrant detector, the quadrant logic arrangement outputting a signal indicative of the quadrant of the magnetic field to the control circuitry, the control circuitry further being configured to modify the signals output by each operational amplifier of the pair of operational amplifiers based on the signal indicative of the quadrant of the magnetic field.

5. The magnetic sensing device according to claim 4, wherein the quadrant logic arrangement comprises at least two comparators.

6. The magnetic sensing device according to claim 1, wherein the control circuitry comprises a plurality of switches, one of the plurality of switches being turned on during the initial period.

7. The magnetic sensing device according to claim 1, wherein the control circuitry comprises a logic gate arrangement for outputting the signal indicative of the quadrant during the initial period.

8. The magnetic sensing device according to claim 1, wherein the angle sensor is an anisotropic magnetoresistive (AMR) based angle sensor.

9. The magnetic sensing device according to claim 1, wherein the quadrant detector is an anisotropic magnetoresistive (AMR) based quadrant detector.

10. The magnetic sensing device according to claim 1, further comprising a sensor package for housing the angle sensor and the quadrant detector.

11. The magnetic sensing device according to claim 1, wherein the control circuitry is further configured to modify the signals output by each operational amplifier of the pair of operational amplifiers to be a digital signal indicative of the quadrant of the magnetic field angle during the initial period.

12. The magnetic sensing device according to claim 1, wherein the pair of operational amplifiers comprise a first operational amplifier to output a first signal comprising a first output of the angle sensor and a second operational amplifier to output a second signal comprising a second output of the angle sensor, the first and second operational amplifiers being electrically connected on independent paths between the angle sensor and an output of the magnetic sensing device.

13. The magnetic sensing device according to claim 12, further comprising:

a sensor package housing the angle sensor, the quadrant detector, the pair of operational amplifiers, and the control circuitry;

a first electrical lead extending from the sensor package and configured to output the first signal from the first operational amplifier; and a second electrical lead extending from the sensor package and configured to output the second signal from the second operational amplifier.

* * * * *